(12) United States Patent
Lee et al.

(10) Patent No.: US 9,130,078 B2
(45) Date of Patent: Sep. 8, 2015

(54) SOLAR CELL AND METHOD FOR MANUFACTURING THE SAME

(75) Inventors: Kyoungsoo Lee, Seoul (KR); Manhyo Ha, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 370 days.

(21) Appl. No.: 13/601,286

(22) Filed: Aug. 31, 2012

(65) Prior Publication Data

US 2013/0255777 A1     Oct. 3, 2013

(30) Foreign Application Priority Data

Mar. 28, 2012   (KR) .................. 10-2012-0031644

(51) Int. Cl.
*H01L 31/042* (2014.01)
*H01L 31/0236* (2006.01)
*H01L 31/0216* (2014.01)
*H01L 31/068* (2012.01)

(52) U.S. Cl.
CPC .... *H01L 31/02363* (2013.01); *H01L 31/02167* (2013.01); *H01L 31/02168* (2013.01); *H01L 31/068* (2013.01); *Y02E 10/547* (2013.01)

(58) Field of Classification Search
CPC ........ H01L 31/00–31/208; Y02E 10/50–10/60
USPC ................................ 136/243–265
See application file for complete search history.

(56) References Cited

U.S. PATENT DOCUMENTS

| | | | |
|---|---|---|---|
| 7,179,527 B2 * | 2/2007 | Sato et al. ..................... | 428/333 |
| 2010/0024871 A1 * | 2/2010 | Oh et al. ........................ | 136/255 |
| 2011/0139243 A1 * | 6/2011 | Shim et al. .................... | 136/259 |
| 2011/0139250 A1 | 6/2011 | Du et al. | |
| 2011/0140226 A1 | 6/2011 | Jin et al. | |
| 2012/0060925 A1 | 3/2012 | Kim | |

FOREIGN PATENT DOCUMENTS

EP    2 149 915 A2    2/2010

OTHER PUBLICATIONS

Wolf et al., "Impact of thin intermediate thermal oxide films on the properties of PECVD passivation layer systems", Photovoltaic Specialists Conference (PVSC), 2011, 37th IEEE, IEEE, Jun. 19, 2011, pp. 3568-3572, XP032167661.

* cited by examiner

*Primary Examiner* — Bach Dinh

(74) *Attorney, Agent, or Firm* — Birch, Stewart, Kolasch & Birch, LLP

(57) ABSTRACT

A solar cell and a method for manufacturing the same are discussed. The solar cell includes a substrate formed of an n-type crystalline semiconductor, an emitter region of a p-type positioned at a first surface of the substrate, a first dielectric layer positioned on a second surface opposite the first surface of the substrate, second dielectric layers respectively positioned on the emitter region and the first dielectric layer, a third dielectric layer positioned on the second dielectric layer that is positioned on the emitter region, a first electrode which is positioned on the first surface of the substrate and is connected to the emitter region, and a second electrode which is positioned on the second surface of the substrate and is connected to the substrate.

13 Claims, 10 Drawing Sheets

SOLAR CELL AND METHOD FOR MANUFACTURING THE SAME

This application claims priority to and the benefit of Korean Patent Application No. 10-2012-0031644 filed in the Korean Intellectual Property Office on Mar. 28, 2012, the entire contents of which are incorporated herein by reference.

BACKGROUND OF THE INVENTION

1. Field of the Invention

Embodiments of the invention relate to a solar cell and a method for manufacturing the same.

2. Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, for example, a substrate and an emitter region, which respectively have different conductive types, for example, a p-type and an n-type and thus form a p-n junction, and electrodes respectively connected to the semiconductor parts of the different conductive types.

When light is incident on the solar cell, electrons inside the semiconductor parts become free electrons (hereinafter referred to as 'electrons') by the photoelectric effect. Further, electrons and holes respectively move to the n-type semiconductor (e.g., the emitter region) and the p-type semiconductor (e.g., the substrate) under the influence of the p-n junction of the semiconductor parts. The electrons moving to the emitter region and the holes moving to the substrate are respectively collected by the respective electrodes electrically connected to the emitter region and the substrate. The electrodes are connected to each other using electric wires to thereby obtain electric power.

SUMMARY OF THE INVENTION

In one aspect, there is a solar cell including a substrate formed of an n-type crystalline semiconductor, an emitter region of a p-type positioned at a first surface of the substrate, a first dielectric layer positioned on a second surface opposite the first surface of the substrate, second dielectric layers respectively positioned on the emitter region and the first dielectric layer, a third dielectric layer positioned on the second dielectric layer that is positioned on the emitter region, a first electrode which is positioned on the first surface of the substrate and is connected to the emitter region, and a second electrode which is positioned on the second surface of the substrate and is connected to the substrate, wherein the emitter region has a first textured surface including a plurality of first protrusions each having a protruding height and a maximum diameter which are within a range of about 5 μm to 10 μm, and wherein each of the plurality of first protrusions has a second textured surface including a plurality of second protrusions each having a protruding height and a maximum diameter which are within a range of about 300 nm to 600 nm.

The first dielectric layer and the third dielectric layer may be formed of hydrogenated silicon nitride. The second dielectric layer may be formed of aluminum oxide.

The second dielectric layer may have a thickness of about 5 nm to 15 nm.

Each of the first dielectric layer and the third dielectric layer may have a thickness of about 70 nm to 100 nm.

The solar cell may further include a hydrogenated silicon oxide layer positioned between the first dielectric layer and the third dielectric layer. The hydrogenated silicon oxide layer may have a thickness of about 50 nm to 100 nm.

The solar cell may further include a silicon oxide layer positioned between the second surface of the substrate and the first dielectric layer. The silicon oxide layer may have a thickness of about 2 nm to 3 nm.

The first surface and the second surface of the substrate may be incident surfaces on which light is incident.

The solar cell may further include a hydrogenated silicon oxide layer positioned on the second dielectric layer that is positioned on the first dielectric layer. The hydrogenated silicon oxide layer may have a thickness of about 50 nm to 100 nm.

The solar cell may further include a silicon oxide layer positioned between the emitter region and the second dielectric layer. The silicon oxide layer may have a thickness of about 2 nm to 3 nm.

Acicular ends of the plurality of second protrusions may point in a parallel direction as vertices of the plurality of first protrusions.

Each of the plurality of second protrusions may have an acicular end, and acicular ends of adjacent second protrusions may be connected by serrated edges.

According to the above-described characteristics of the solar cell, because the surface of the substrate has the first and second textured surfaces, an amount of light incident on the substrate increases. Hence, the efficiency of the solar cell is improved.

Furthermore, because an anti-reflection layer including the plurality of dielectric layers and a passivation layer including the plurality of dielectric layers are respectively formed on a front surface and a back surface of the substrate, a reflection amount of light decreases. Hence, a surface passivation effect is generated at the surface of the substrate, and the efficiency of the solar cell is further improved.

Furthermore, because a field passivation effect is obtained by stacking a layer having negative fixed charges on the n-type substrate, a loss amount of carriers of the solar cell decreases.

In addition, because the problem resulting from a natural oxide layer is reduced by thinly coating the silicon oxide layer on at least one of the front surface and the back surface of the substrate, the efficiency of the solar cell is further improved.

In another aspect, there is a method for manufacturing a solar cell including performing a wet etching process to form a first textured surface on at least one surface of a substrate, performing a dry etching process to form a second textured surface on the first textured surface, and performing an ion implantation process to implant impurity ions into the first textured surface and the second textured surface and performing an activation process to form at least one of an emitter region and a back surface field region.

The wet etching process may be performed using an alkali solution such as isopropyl alcohol (IPA) or potassium hydroxide (KOH).

The first textured surface including a plurality of first protrusions and a plurality of first depressions may be formed through the wet etching process using the alkali solution. A protruding height and a diameter of each of the plurality of first protrusions may be within the range of about 5 μm to 10 μm.

The dry etching process may be performed using a reaction ion etching (RIE) method.

The second textured surface including a plurality of second protrusions and a plurality of second depressions may be formed through the dry etching process using the reaction ion etching method. A protruding height and a diameter of each of the plurality of second protrusions may be within the range of about 300 nm to 600 nm.

The method may further include, after forming the second textured surface, performing the dry etching process to remove a remainder of the substrate.

The first and second textured surfaces may be formed on a first surface of the substrate, and the first and second textured surfaces are formed on a second surface opposite the first surface. In this instance, the emitter region may be formed at the first surface of the substrate, and the back surface field region may be locally formed at the second surface of the substrate.

In the embodiment of the invention, the local formation of the back surface field region indicates that the back surface field region is formed in the same pattern as the plurality of finger electrodes of the second electrode part at the second surface of the substrate.

Accordingly, the back surface field region is locally formed at the second surface of the substrate, unlike the emitter region entirely formed at the first surface of the substrate.

In the embodiment of the invention, the formation of the emitter region at the entire first surface of the substrate indicates that the emitter region is formed at the entire first surface of the substrate except an edge.

The emitter region may be formed by implanting and activating first impurity ions, and the back surface field region may be formed by implanting and activating second impurity ions of a conductive type opposite the first impurity ions. An activation process of the first impurity ions and the second impurity ions may be performed at a temperature of about 1,000° C. to 2,000° C. capable of activating the first impurity ions for about 20 minutes to 60 minutes.

The method may further include performing the activation process to remove damaged portions of the first and second surfaces of the substrate resulting from the dry etching process.

The method may further include forming a first dielectric layer on the second surface of the substrate, simultaneously forming second dielectric layers respectively on the emitter region and the first dielectric layer, forming a third dielectric layer on the second dielectric layer that is positioned on the emitter region, and forming a first electrode part, which includes a plurality of finger electrodes and is connected to the emitter region, and a second electrode part, which includes a plurality of finger electrodes and is connected to the back surface field region.

At least one of the first electrode part and the second electrode part may include at least one bus electrode extending in a direction crossing the finger electrodes.

Each of the first dielectric layer and the third dielectric layer may be formed by depositing hydrogenated silicon nitride at a thickness of about 70 nm to 100 nm. The second dielectric layer may be formed by depositing aluminum oxide at a thickness of about 5 nm to 15 nm using an atomic layer deposition (ALD) method.

The method may further include forming a fourth dielectric layer between the first dielectric layer and the second dielectric layer and on the third dielectric layer. The fourth dielectric layer may be formed by depositing hydrogenated silicon oxide at a thickness of about 50 nm to 100 nm.

The method may further include, before forming the first dielectric layer, forming a fifth dielectric layer on the first and second surfaces of the substrate. The forming of the fifth dielectric layer may include immersing the substrate in a nitric acid solution having a hydrogen ion concentration (pH) of about 2 to 4 for about 5 minutes to 30 minutes to form a silicon oxide layer having a thickness of about 2 nm to 3 nm.

The back surface field region may be formed in the same pattern as the plurality of finger electrodes of the second electrode part.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
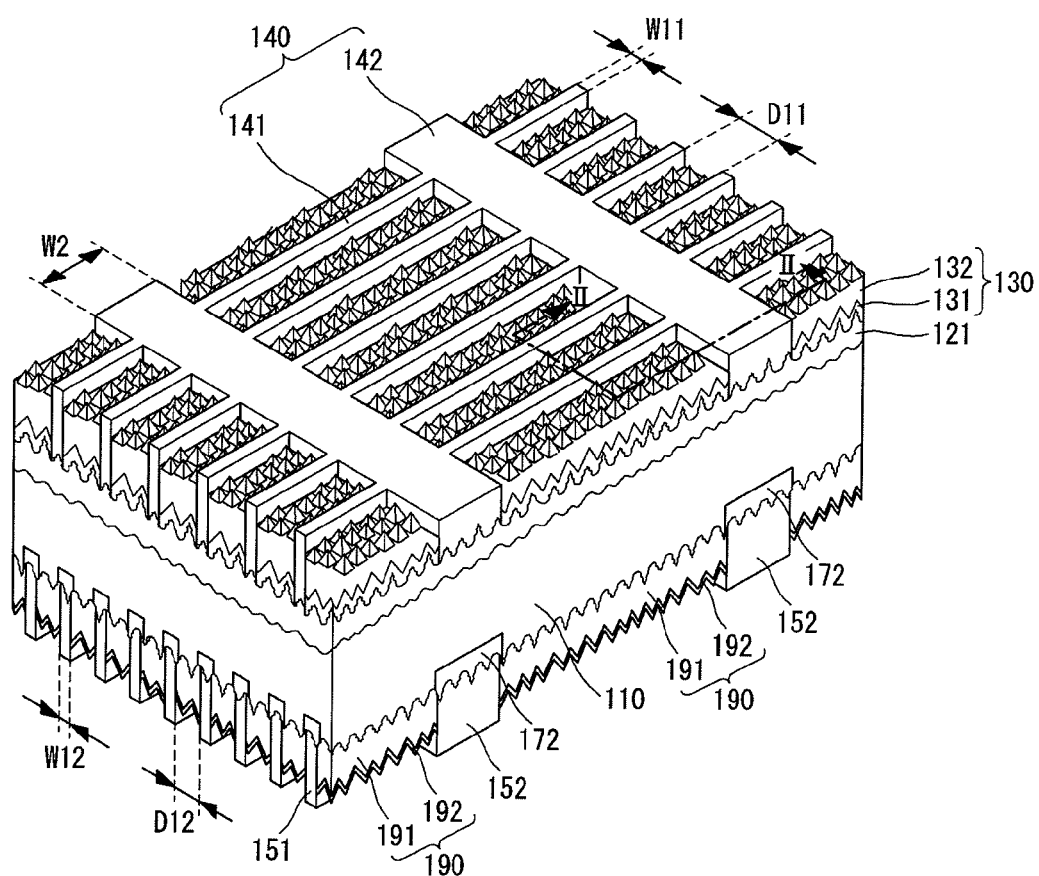
FIG. 1 is a partial perspective view of a solar cell according to an example embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be paid attention that detailed description of known arts will be omitted if it is determined that the arts can mislead the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, it will be understood that when an element such as a layer, film, region, or substrate is referred to as being "entirely" on other element, it may be on the entire surface of the other element and may not be on a portion of an edge of the other element.

Example embodiments of the invention will be described in detail with reference to FIGS. 1 to 7.

A solar cell according to an example embodiment of the invention is described in detail with reference to FIGS. 1 and 2.

Figure 2:
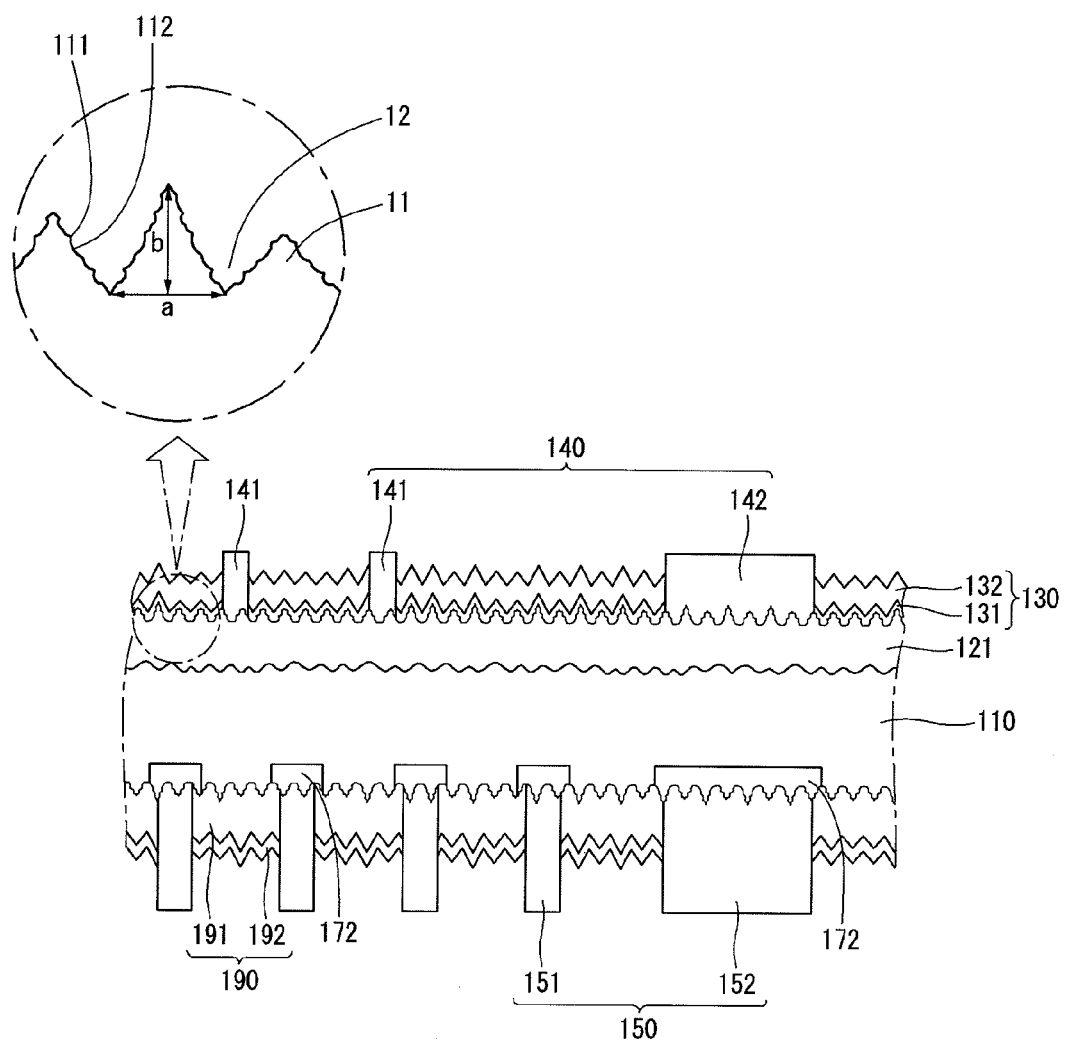
FIG. 2 is a cross-sectional view taken along line II-II of FIG. 1.

As shown in FIGS. 1 and 2, a solar cell according to an example embodiment of the invention includes a substrate 110, an emitter region 121 positioned at a front surface (or a first surface) of the substrate 110, an anti-reflection layer 130 positioned on the emitter region 121, a passivation layer 190 positioned on a back surface (or a second surface) opposite the front surface of the substrate 110, a front electrode part (or a first electrode part) 140 which is positioned on the front surface of the substrate 110, is connected to the emitter region 121, and includes a plurality of front electrodes (or a plurality of first electrodes) 141 and a plurality of front bus bars (or a plurality of first bus bars) 142, a back electrode part (or a second electrode part) 150 which is positioned on the back surface of the substrate 110 and includes a plurality of back electrodes (or a plurality of second electrodes) 151 and a plurality of back bus bars (or a plurality of second bus bars) 152, and a plurality of back surface field regions 172 positioned under the plurality of back electrodes 151 and the plurality of back bus bars 152 at the back surface of the substrate 110.

In the embodiment of the invention, light is incident on at least one of the front surface and the back surface of the substrate 110.

The substrate 110 is a semiconductor substrate formed of a semiconductor such as first conductive type silicon, for example, n-type silicon, though not required. The semiconductor used in the substrate 110 is a crystalline semiconductor, such as single crystal silicon and polycrystalline silicon. The n-type substrate 110 is doped with impurities of a group V element such as phosphorus (P), arsenic (As), and antimony (Sb).

Figure 3:
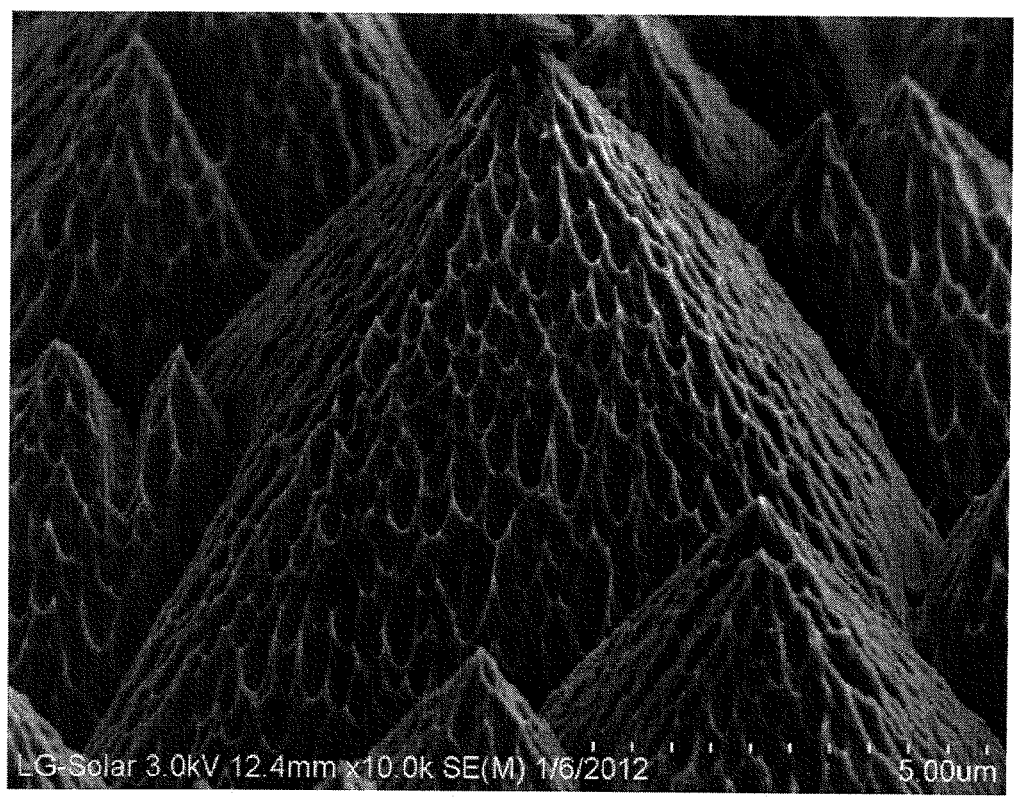
FIG. 3 illustrates a portion of a substrate of the solar cell shown in FIGS. 1 and 2, on which a wet etching process and a dry etching process are performed.

As shown in FIGS. 1 to 3, a separate texturing process is entirely performed on the flat front surface of the substrate 110 to form a first textured surface corresponding to an uneven surface or having uneven characteristics, and including a plurality of first protrusions 11 and a plurality of first depressions 12. In this instance, the emitter region 121 and the anti-reflection layer 130 positioned on the front surface of the substrate 110 have the textured surface.

Each of the first protrusions 11 has a pyramid shape or a similar shape.

In the embodiment of the invention, a diameter (i.e., size) 'a' and a protruding height 'b' of each of the first protrusions 11 may be within the range of several µm, for example, about 5 µm to 10 µm. An aspect ratio 'b/a' of each first protrusion 11 may be about 1.0 to 1.5. In the embodiment of the invention, the aspect ratio 'b/a' is obtained by dividing the protruding height 'b' of the first protrusion 11 by the diameter 'a' of the first protrusion 11. The diameter 'a' of the first protrusion 11 is a width of the base of the first protrusion 11.

Because the plurality of first protrusions 11 are positioned on the front surface of the substrate 110, an incident area of the substrate 110 increases and a light reflectance decreases due to a plurality of reflection operations resulting from each first protrusion 11. Hence, an amount of light incident on the substrate 110 increases, and the efficiency of the solar cell is improved.

As shown in FIGS. 2 and 3, a plurality of second protrusions 111 and a plurality of second depressions 112 are formed on the surface of each first protrusion 11. Thus, the surface of each first protrusion 11 has a second textured surface corresponding to an uneven surface or having uneven characteristics, and including the plurality of second protrusions 111 and the plurality of second depressions 112.

A diameter (i.e., size) and a protruding height of each of the second protrusions 111 included in each first protrusion 11 are less than the diameter (i.e., size) and the protruding height of each first protrusion 11.

For example, the diameter and the protruding height of each second protrusion 111 may be within the range of several hundreds of nm. For example, each second protrusion 111 may have the maximum diameter and the protruding height of about 300 nm to 600 nm.

Because the surface of each first protrusion 11 has the second textured surface, the incident area of the substrate 110 further increases. Further, because a reflection operation of light is repeatedly performed, an amount of light incident on the substrate 110 further increases.

As described above, the surface of the substrate 110 forms the first textured surface having the first protrusions 11 and the first depressions 12, and the surface of each first protrusion 11 forms the second textured surface having the second protrusions 111 and the second depressions 112. Namely, the surface of the substrate 110 has the first and second textured surfaces. Thus, a reflectance (for example, an average weighted reflectance) of light having a wavelength of about 300 nm to 1,100 nm has a small value of about 1% to 10%.

As shown in FIGS. 2 and 3, the first protrusions 11 have a plurality of surfaces that meet at respective vertices that are generally piked. Each of the plurality of surfaces of the first protrusions 11 has a plurality of second protrusions 111 that have acicular ends. Each of the second protrusions 111 are connected to other second protrusions 111 by serrated edges that defined the plurality of depressions 112. The plurality of second protrusions 111 generally point in a parallel direction as the vertices of the plurality of first protrusions 11. The plurality of depressions 112 are also generally hollowed out in the parallel direction as the vertices of the plurality of first protrusions 11.

In the embodiment of the invention, when the substrate 110 is formed of single crystal silicon, the first textured surface 11(12) may be formed through a wet etching method using an alkali solution such as isopropyl alcohol (IPA) or potassium hydroxide (KOH), and the second textured surface 111(112) may be formed through a dry etching method such as a reaction ion etching (RIE) method.

The emitter region 121 positioned at the front surface of the substrate 110 is an impurity region doped with impurities of a second conductive type (for example, p-type) opposite the first conductive type (for example, n-type) of the substrate 110. Thus, the emitter region 121 of the second conductive type forms a p-n junction along with a first conductive type region (for example, an n-type region) of the substrate 110.

In the embodiment of the invention, the emitter region 121 may have a sheet resistance of about 70 Ω/sq. to 80 Ω/sq.

Regarding carriers, for example, electrons and holes produced by light incident on the substrate 110, the electrons and the holes respectively move to the n-type semiconductor and the p-type semiconductor by a built-in potential difference resulting from the p-n junction between the substrate 110 and the emitter region 121. Thus, when the substrate 110 is of the n-type and the emitter region 121 is of the p-type, the electrons and the holes move to the substrate 110 and the emitter region 121, respectively.

When the emitter region 121 is of the p-type, the emitter region 121 may be formed by doping the substrate 110 with impurities of a group III element such as boron (B), gallium (Ga), and indium (In). In this instance, the emitter region 121 may be formed using an ion implantation method.

The anti-reflection layer 130 includes a first anti-reflection layer 131 positioned on the emitter region 121 and a second anti-reflection layer 132 positioned on the first anti-reflection layer 131.

In the embodiment of the invention, the first anti-reflection layer 131 may be formed of aluminum oxide ($Al_2O_3$), and the second anti-reflection layer 132 may be formed of hydrogenated silicon nitride (SiNx:H).

The first anti-reflection layer 131 formed of aluminum oxide ($Al_2O_3$) may have a thickness of about 5 nm to 15 nm and a refractive index of about 1.1 to 1.6. The second anti-reflection layer 132 formed of hydrogenated silicon nitride (SiNx:H) may have a thickness of about 70 nm to 100 nm and a refractive index of about 2.0 to 2.2.

In this instance, because the refractive index of the first anti-reflection layer 131 adjacent to the substrate 110 is less than the refractive index of the second anti-reflection layer 132 adjacent to air, an anti-reflection effect is reduced by the refractive index of the first anti-reflection layer 131. It is preferable, but not required, that the thickness of the first anti-reflection layer 131 is much less than the thickness of the second anti-reflection layer 132, so as to prevent a reduction in the anti-reflection effect.

The first anti-reflection layer 131 formed of aluminum oxide ($Al_2O_3$) is positioned on the front surface of the substrate 110, i.e., directly on the emitter region 121 positioned at the front surface of the substrate 110.

In general, aluminum oxide ($Al_2O_3$) has the characteristic of negative fixed charges.

Thus, positive fixed charges (i.e., holes) are drawn to the p-type emitter region 121 and electrons are pushed to the back surface of the substrate 110 by the first anti-reflection layer 131 formed of aluminum oxide ($Al_2O_3$) having negative fixed charges. Namely, a field passivation effect is obtained.

Accordingly, an amount of holes moving to the emitter region 121 further increases by the first anti-reflection layer 131 formed of aluminum oxide ($Al_2O_3$), and an amount of electrons moving to the emitter region 121 decreases by the first anti-reflection layer 131. Hence, a recombination of electrons and holes at and around the emitter region 121 is reduced.

Oxygen (O) contained in aluminum oxide ($Al_2O_3$) for forming the first anti-reflection layer 131 moves to the surface of the substrate 110 abutting on the first anti-reflection layer 131 to thereby perform a passivation function for converting a defect, for example, dangling bonds existing at and around the surface of the substrate 110 into stable bonds.

The first anti-reflection layer 131 formed of aluminum oxide ($Al_2O_3$) may be formed using an atomic layer deposition (ALD) method having an excellent step coverage.

As described above, the first textured surface 11(12) using the wet etching method and the second textured surface 111(112) using the dry etching method are formed on the front surface of the substrate 110. Therefore, a roughness of the front surface (i.e., the surface of the emitter region 121) of the substrate 110 abutting on the first anti-reflection layer 131 further increases compared to when only the first textured surface 11(12) is formed.

If the first anti-reflection layer 131 is formed directly on the emitter region 121 using a deposition method such as a plasma enhanced chemical vapor deposition (PECVD) method, the first anti-reflection layer 131 may not be normally coated on the first and second protrusions 11 and 111 and the first and second depressions 12 and 112. Hence, a non-formation area of the first anti-reflection layer 131 may increase in the first and second textured surfaces of the substrate 110.

In this instance, a surface passivation effect may be not generated in the non-formation area of the first anti-reflection layer 131. As a result, an amount of carriers lost at and around the surface of the substrate 110 may increase.

On the other hand, in the embodiment of the invention, the first anti-reflection layer 131 is formed on the emitter region 121 using the atomic layer deposition method having the excellent step coverage. Therefore, the first anti-reflection layer 131 is normally formed on the first and second protrusions 11 and 111 and the first and second depressions 12 and 112. Hence, the non-formation area of the first anti-reflection layer 131 decreases in the first and second textured surfaces of the substrate 110.

Accordingly, because a formation area of the first anti-reflection layer 131 increases in the first and second textured surfaces of the substrate 110, the surface passivation effect using the first anti-reflection layer 131 is improved. Hence, an amount of carriers lost at and around the surface of the substrate 110 decreases, and the efficiency of the solar cell is improved.

The second anti-reflection layer 132 formed of hydrogenated silicon nitride (SiNx:H) is positioned directly on the first anti-reflection layer 131 on the front surface of the substrate 110.

Hydrogen (H) contained in hydrogenated silicon nitride (SiNx:H) for forming the second anti-reflection layer 132 moves to the surface of the substrate 110 via the first anti-reflection layer 131 to thereby perform a passivation function at and around the surface of the substrate 110.

An amount of carriers lost at and around the surface of the substrate 110 further decreases by the passivation function using both the first and second anti-reflection layers 131 and 132.

As described above, because the double-layered anti-reflection layer 130 including the first anti-reflection layer 131 formed of aluminum oxide ($Al_2O_3$) and the second anti-reflection layer 132 formed of hydrogenated silicon nitride (SiNx:H) is formed on the front surface of the substrate 110, the field passivation effect using the fixed charges of the first anti-reflection layer 131 and the surface passivation effect using the first and second anti-reflection layers 131 and 132 are obtained in addition to the anti-reflection effect of light using changes in the refractive indexes of the first and second anti-reflection layers 131 and 132.

When the thickness of the first anti-reflection layer 131 formed of aluminum oxide is equal to or greater than about 5 nm, the aluminum oxide layer 131 is more uniformly formed and the field passivation effect using the fixed charges of the first anti-reflection layer 131 is more stably obtained. When the thickness of the first anti-reflection layer 131 is equal to or less than about 15 nm, manufacturing time and cost of the first anti-reflection layer 131 are reduced without a reduction in the anti-reflection effect resulting from the refractive index of the first anti-reflection layer 131.

When the thickness of the second anti-reflection layer 132 formed of hydrogenated silicon nitride is equal to or greater than about 70 nm, the silicon nitride layer 132 is more uniformly formed and the surface passivation effect using hydrogen (H) is more stably obtained. When the thickness of the second anti-reflection layer 132 is equal to or less than about 100 nm, manufacturing time and cost of the second anti-reflection layer 132 are reduced without a reduction in the field passivation effect using silicon nitride having positive fixed charges.

Each of the plurality of back surface field regions 172 positioned at the back surface of the substrate 110 is a region that is more heavily doped than the substrate 110 with impurities of the same conductive type (for example, the n-type) as the substrate 110.

The back surface field regions 172 abut on the back electrodes 151 and the back bus bars 152 positioned on the back surface of the substrate 110, and are selectively or locally positioned at the back surface of the substrate 110.

Hence, the back surface field regions 172 are not positioned between the adjacent back electrodes 151, between the back electrodes 151 and the back bus bars 152, and between the adjacent back bus bars 152.

A potential barrier is formed by a difference between impurity concentrations of the first conductive type region (for example, the n-type region) of the substrate 110 and the back surface field regions 172. Hence, the potential barrier prevents or reduces holes from moving to the back surface field regions 172 used as a moving path of electrons and makes it easier for electrons to move to the back surface field regions 172.

Thus, the back surface field regions 172 reduce an amount of carriers lost by a recombination and/or a disappearance of the electrons and the holes at and around the back surface of the substrate 110 and accelerate a movement of desired carriers (for example, electrons), thereby increasing an amount of carriers moving to the back electrode part 150.

Because the impurity concentration of the back surface field regions 172 is higher than the impurity concentration of the substrate 110, the conductivity of the back surface field regions 172 abutting on the back electrode part 150 is greater than the conductivity of the substrate 110. Hence, a movement of carriers from the back surface field regions 172 to the back electrode part 150 is easily carried out.

The passivation layer 190 includes a first passivation layer 191 positioned directly on the back surface of the substrate 110 and a second passivation layer 192 positioned directly on the first passivation layer 191.

The first passivation layer 191 may be formed of hydrogenated silicon nitride (SiNx:H), and the second passivation layer 192 may be formed of aluminum oxide ($Al_2O_3$).

In the embodiment of the invention, the first passivation layer 191 and the second anti-reflection layer 132 may be simultaneously formed through the same process, or the second passivation layer 192 and the first anti-reflection layer 131 may be simultaneously formed through the same process.

Hence, the first passivation layer 191 may be formed of the same material as the second anti-reflection layer 132 and thus may have the same characteristics, for example, thickness, properties, component, composition (or composition ratio), refractive index, etc., as the second anti-reflection layer 132. Further, the second passivation layer 192 may be formed of the same material as the first anti-reflection layer 131 and thus may have the same characteristics, for example, thickness, properties, component, composition (or composition ratio), refractive index, etc., as the first anti-reflection layer 131.

More specifically, the first passivation layer 191 formed of hydrogenated silicon nitride (SiNx:H) may have a thickness of about 70 nm to 100 nm and a refractive index of about 2.0 to 2.2. The second passivation layer 192 formed of aluminum oxide ($Al_2O_3$) may have a thickness of about 5 nm to 15 nm and a refractive index of about 1.1 to 1.6.

Because the first passivation layer 191 formed of hydrogenated silicon nitride (SiNx:H) is positioned on the back surface field regions 172 positioned directly on the back surface of the substrate 110, the surface passivation function using hydrogen (H) is performed. Hence, an amount of carriers lost at and around the back surface of the substrate 110 decreases.

Hydrogenated silicon nitride (SiNx:H) has the characteristic of positive fixed charges opposite aluminum oxide ($Al_2O_3$).

In the embodiment of the invention, the substrate 110 is of the n-type, and the first passivation layer 191, which is formed directly on the back surface of the substrate 110 using silicon nitride, has the characteristic of positive fixed charges. Hence, negative charges (i.e., electrons) moving to the first passivation layer 191 have a polarity opposite the first passivation layer 191 formed of silicon nitride. As a result, the electrons are drawn to the first passivation layer 191 because of the positive polarity of the first passivation layer 191. On the other hand, positive charges (i.e., holes) have the same polarity as the first passivation layer 191 and thus are pushed to the front surface of the substrate 110 opposite the first passivation layer 191 because of the positive polarity of the first passivation layer 191.

Hence, when the first passivation layer 191 is formed directly on the back surface of the n-type substrate 110 using hydrogenated silicon nitride (SiNx:H), an amount of electrons moving to the back surface of the substrate 110 further increases because of the influence of positive fixed charges. Further, the recombination of the electrons and the holes at and around the back surface of the substrate 110 is reduced.

The second passivation layer 192, which is formed on the first passivation layer 191 using aluminum oxide ($Al_2O_3$), prevents hydrogen (H) contained in the first passivation layer 191 from moving to the back electrode part 150 opposite the front surface of the substrate 110 because of heat applied when the solar cell is manufactured. As a result, the surface passivation effect of the back surface of the substrate 110 using hydrogen (H) contained in the first passivation layer 191 is improved.

As described above, the double-layered passivation layer 190 including the first passivation layer 191 formed of hydrogenated silicon nitride (SiNx:H) and the second passivation layer 192 formed of aluminum oxide ($Al_2O_3$) is formed on the back surface of the substrate 110, in the same manner as the double-layered anti-reflection layer 130 positioned on the front surface of the substrate 110. Hence, the surface passivation effect of the back surface of the substrate 110 is improved.

It is preferable, but not required, that the thickness of the first passivation layer 191 is greater than the thickness of the second passivation layer 192 positioned on the first passivation layer 191, so that the second passivation layer 192 having the negative fixed charges does not adversely affect the first passivation layer 191 having the positive fixed charges. Further, the thickness of the first passivation layer 191 may be greater than the thickness of the second anti-reflection layer 132 on the front surface of the substrate 110.

Accordingly, if necessary, the thickness of the hydrogenated silicon nitride layer (i.e., the second anti-reflection layer 132) positioned on the front surface of the substrate 110 may be different from the thickness of the silicon nitride layer (i.e., the first passivation layer 191) positioned on the back surface of the substrate 110. In this instance, the silicon nitride layer (i.e., the second anti-reflection layer 132) positioned on the front surface of the substrate 110 may have the thickness of about 90 nm, and the silicon nitride layer (i.e., the first passivation layer 191) positioned on the back surface of the substrate 110 may have the thickness of about 100 nm.

When light is incident on the back surface of the substrate 110, a refractive index in going from air to the substrate 110 increases. Therefore, a reflection amount of light incident on the back surface of the substrate 110 decreases, and an amount of light absorbed in the substrate 110 increases. Hence, when light is incident on the back surface of the substrate 110, the passivation layer 190 serves as an anti-reflection layer.

The plurality of front electrodes 141 of the front electrode part 140 are connected to the emitter region 121, and the plurality of front bus bars 142 of the front electrode part 140 are connected to the front electrodes 141 as well as the emitter region 121.

The front electrodes 141 are electrically and physically connected to the emitter region 121 and are separated from one another. The front electrodes 141 extend parallel to one another in a fixed direction. The front electrodes 141 collect carriers (for example, holes) moving to the emitter region 121.

The front bus bars 142 are electrically and physically connected to the emitter region 121 and extend parallel to one another in a direction crossing the front electrodes 141.

The front bus bars 142 have to collect not only carriers (for example, holes) moving from the emitter region 121 but also carriers collected by the front electrodes 141 crossing the front bus bars 142 and have to move the collected carriers in a desired direction. Thus, a width of each front bus bar 142 may be greater than a width of each front electrode 141.

In the embodiment of the invention, the front bus bars 142 are positioned on the same level layer as the front electrodes 141 and are electrically and physically connected to the front electrodes 141 at crossings of the front electrodes 141 and the front bus bars 142.

Accordingly, as shown in FIG. 1, the plurality of front electrodes 141 have a stripe shape extending in a transverse (or longitudinal) direction, and the plurality of front bus bars 142 have a stripe shape extending in a direction crossing the front electrodes 141, for example, in a longitudinal (or transverse) direction. Hence, the front electrode part 140 has a lattice shape on the front surface of the substrate 110.

The front bus bars 142 are connected to an external device and output the collected carriers to the external device.

The front electrode part 140 including the front electrodes 141 and the front bus bars 142 is formed of at least one conductive material, for example, silver (Ag).

The plurality of back electrodes 151 of the back electrode part 150 are positioned on the back surface field regions 172 and directly abut on the back surface field regions 172. The back electrodes 151 are separated from one another and extend in a fixed direction in the same manner as the front electrodes 141. In this instance, the back electrodes 151 extend in the same direction as the front electrodes 141. The back electrodes 151 collect carriers (for example, electrons) moving to the back surface field regions 172.

The plurality of back bus bars 152 of the back electrode part 150 are positioned on the back surface field regions 172 and abut on the back surface field regions 172. The back bus bars 152 extend parallel to one another in a direction crossing the back electrodes 151. In this instance, the back bus bars 152 extend in the same direction as the front bus bars 142. The back bus bars 152 may be positioned opposite the front bus bars 142 with the substrate 110 interposed between them.

The back bus bars 152 collect carriers (for example, electrons) collected by the back electrodes 151 crossing the back bus bars 152 and move the collected carriers in a desired direction. Thus, a width of each back bus bar 152 may be greater than a width of each back electrode 151.

The back bus bars 152 are positioned on the same level layer as the back electrodes 151 and are electrically and physically connected to the back electrodes 151 at crossings of the back electrodes 151 and the back bus bars 152.

Thus, the back electrode part 150 has a lattice shape on the back surface of the substrate 110 in the same manner as the front electrode part 140.

The back electrodes 151 and the back bus bars 152 may contain the same conductive material, for example, silver (Ag) as the front electrodes 141 and the front bus bars 142. Alternatively, the back electrode part 150 may be formed of a material different from the front electrode part 140, and the back electrodes 151 may be formed of a material different from the back bus bars 152.

As described above, in the embodiment of the invention, the back surface field regions 172 are positioned under the back electrodes 151 and the back bus bars 152 and extend along the back electrodes 151 and the back bus bars 152. Hence, the back surface field regions 172 are selectively or locally positioned at the back surface of the substrate 110 and have a lattice shape in the same manner as the back electrode part 150. Thus, as described above, a non-formation portion of the back surface field regions 172 exists at the back surface of the substrate 110.

In the embodiment of the invention, the number of front electrode 141, which are positioned on the front surface of the substrate 110 and receive the most of light, is less than the number of back electrode 151, which are positioned on the back surface of the substrate 110 and receive a smaller amount of light than the front surface of the substrate 110. Thus, a distance between the two adjacent front electrodes 141 is greater than a distance between the two adjacent back electrodes 151.

As described above, because the front electrode part 140 and the back electrode part 150 contain a metal material such as silver (Ag), the front electrode part 140 and the back electrode part 150 do not transmit light.

Because the distance between the front electrodes 141 is greater than the distance between the back electrodes 151, a reduction in an incident area of light at the front surface of the substrate 110 is reduced or prevented by the arrangement of the front electrodes 141. Hence, an amount of light incident on the front surface of the substrate 110 increases.

In another embodiment, the front bus bars 142, the back bus bars 152, or both may be omitted if needed or desired.

In the embodiment of the invention, at least one of the front electrode part 140 and the back electrode part 150 may be formed using a plating method.

When at least one of the front electrode part 140 and the back electrode part 150 is formed using the plating method, at least one of the front electrode part 140 and the back electrode part 150 may have a single-layered structure as in the embodiment of the invention. Alternatively, at least one of the front electrode part 140 and the back electrode part 150 may have a multi-layered structure such as a double-layered structure and a triple-layered structure. When at least one of the front electrode part 140 and the back electrode part 150 formed using the plating method has the single-layered structure, at least one of the front electrode part 140 and the back electrode part 150 may be formed of silver (Ag).

When at least one of the front electrode part 140 and the back electrode part 150 formed using the plating method has the double-layered structure, a lower layer (or a first layer), which abuts on the emitter region 121 (i.e., a second conductive type region of the substrate 110) or abuts on the back surface field regions 172 (i.e., a heavily doped region of the substrate 110 doped with impurities of the first conductive type), may be formed of nickel (Ni), and an upper layer (or a second layer) on the lower layer may be formed of silver (Ag).

When at least one of the front electrode part 140 and the back electrode part 150 formed using the plating method has the triple-layered structure, a lower layer (or a first layer) abutting on the emitter region 121 or the back surface field regions 172 may be formed of nickel (Ni), a middle layer (or a second layer) on the lower layer may be formed of copper (Cu), and an upper layer (or a third layer) on the middle layer may be formed of silver (Ag) or tin (Sn).

When at least one of the front electrode part 140 and the back electrode part 150 formed using the plating method has the double-layered structure, a thickness of the lower layer may be about 0.5 µm to 1 µm, and a thickness of the upper layer may be about 5 µm to 10 µm. When at least one of the front electrode part 140 and the back electrode part 150 formed using the plating method has the triple-layered structure, each of the lower layer and the upper layer may have a thickness of about 0.5 µm to 1 µm, and a thickness of the middle layer may be about 5 µm to 10 µm.

In this instance, the lower layer is to reduce a contact resistance between the lower layer and the emitter region 121 or the back surface field regions 172 abutting on the lower layer, and is to improve contact characteristics. The middle layer may be formed of a relatively inexpensive material with good conductivity, for example, copper (Cu) in consideration of cost reduction. If the middle layer is formed of copper (Cu), the lower layer underlying the middle layer may prevent copper (Cu), which is smoothly bonded to silicon (Si), from serving as an impurity region, which is penetrated (absorbed) in the emitter region 121 or the back surface field regions 172 formed of silicon (Si) to thereby reduce or prevent the movement of carriers.

The upper layer prevents the oxidation of the layer (for example, the lower layer or the middle layer) underlying the upper layer and improves an adhesive strength between the layer (for example, the lower layer or the middle layer) and a conductive film, for example, a ribbon positioned on the upper layer.

As described above, at least one of the front electrode part 140 and the back electrode part 150 formed using the plating method may have the double-layered structure or the triple-layered structure, and the lower layer may be formed of nickel (Ni). In this instance, nickel silicide compounds exist between the lower layer and the emitter region 121 or between the lower layer and the back surface field regions 172 because of a bond between nickel (Ni) and silicon (Si) of the emitter region 121 (i.e., the second conductive type region of the substrate 110) or a bond between nickel (Ni) and silicon (Si) of the back surface field regions 172 (i.e., the heavily doped region of the substrate 110 doped with impurities of the first conductive type).

Alternatively, at least one of the front electrode part 140 and the back electrode part 150 may be formed through a screen printing method using an Ag paste containing a glass frit or an Al paste containing the glass frit. In this instance, the glass frit may pass through the anti-reflection layer 130 or the passivation layer 190 and may abut on the emitter region 121 or the back surface field regions 172.

Accordingly, at least one of components of the glass frit is detected in a contact portion between the front electrode part 140 and the emitter region 121 or a contact portion between the back electrode part 150 and the back surface field regions 172. For example, at least one of lead (Pb)-based material such as PbO, bismuth (Bi)-based material such as $Bi_2O_3$, aluminum (Al)-based material such as $Al_2O_3$, boron (B)-based material such as $B_2O_3$, tin (Sn)-based material, zinc (Zn)-based material such as ZnO, titanium (Ti)-based material such as TiO, and phosphorus (P)-based material such as $P_2O_5$ contained in the glass frit may be detected.

On the other hand, when at least one of the front electrode part 140 and the back electrode part 150 is formed using the plating method, the component of the glass fit is not detected between the substrate 110 (i.e., the emitter region 121) and the front electrode part 140 including the front electrodes 141 and the front bus bars 142 and between the substrate 110 (i.e., the back surface field regions 172) and the back electrode part 150 including the back electrodes 151 and the back bus bars 152.

As described above, when at least one of the front electrode part 140 and the back electrode part 150 has the multi-layered structure, the lower layer, the middle layer, and the upper layer are sequentially formed using the plating method to have a desired thickness.

In the embodiment of the invention, the number of front electrodes 141, the number of front bus bars 142, the number of back electrodes 151, and the number of back bus bars 152 may vary, if desired or necessary.

Each front bus bar 142 and each back bus bar 152 respectively collect carriers from the emitter region 121 and the back surface field regions 172, and also respectively output carriers collected by the front electrodes 141 and carriers collected by the back electrodes 151 to the external device.

In another embodiment, at least one of the front bus bar 142 and the back bus bar 152 may be positioned directly on at least one of the anti-reflection layer 130 and the passivation layer 190 and may abut on at least one of the anti-reflection layer 130 and the passivation layer 190.

As described above, because each of the front surface and the back surface of the substrate 110 has the first and second textured surfaces, a surface area of the substrate 110 increases.

Hence, an area of the emitter region 121 contacting each front electrode 141 and an area of the back surface field region 172 contacting each back electrode 151 increase. Therefore, even if a width W11 of each front electrode 141 and a width W12 of each back electrode 151 decrease, a contact area between the emitter region 121 and the front electrode 141 and a contact area between the back surface field region 172 and the back electrode 151 may not decrease.

As a result, even if the width W11 of each front electrode 141 and the width W12 of each back electrode 151 decrease, an amount of carriers moving from the emitter region 121 to the front electrodes 141 and an amount of carriers moving from the back surface field regions 172 to the back electrodes 151 may not decrease.

In the embodiment of the invention, the width W11 of each front electrode 141 and the width W12 of each back electrode 151 may be about 40 µm to 50 µm. The widths W11 and W12 are much less than a width (of about 60 µm to 100 µm) of electrodes of a comparative example.

As described above, because formation areas of the front electrodes 141 and the back electrodes 151 to prevent or reduce the incidence of light at the front surface and the back surface of the substrate 110 are reduced, an amount of light incident on the front surface and the back surface of the substrate 110 increases.

However, a moving distance of carriers moving to the front electrodes 141 along the emitter region 121 and a moving distance of carriers moving to the back electrodes 151 along the back surface field regions 172 increase because of the first and second textured surfaces of the substrate 110.

Accordingly, in the embodiment of the invention, a distance D11 between the two adjacent front electrodes 141 and a distance D12 between the two adjacent back electrodes 151 may decrease, so as to compensate for an increase in the moving distance of carriers resulting from an increase in a surface area of the emitter region 121 and a surface area of the back surface field regions 172. For example, the distance D11 between the two adjacent front electrodes 141 and the distance D12 between the two adjacent back electrodes 151 may be equal to or greater than about 1.5 mm and less than about 2.0 mm.

As described above, because the width W11 of each front electrode 141 and the width W12 of each back electrode 151 decrease, an incident area of light at the front surface and the back surface of the substrate 110 does not decrease even if the distances D11 and D12 increases.

An operation of the solar cell having the above-described structure is described below.

When light irradiated to the solar cell is incident on the substrate 110 and at least one of the emitter region 121 and the back surface field region 172, each of which is the semiconductor part, through at least one of the anti-reflection layer 130 and the passivation layer 190, electrons and holes are generated in the substrate 110 by light energy produced based on the incident light. In this instance, because a reflection loss of the light incident on the substrate 110 is reduced by the first and second textured surfaces of the substrate 110, the anti-reflection layer 130, and the passivation layer 190, an amount of light incident on the substrate 110 increases.

The electrons move to the n-type semiconductor part (for example, the substrate 110) and the holes move to the p-type semiconductor part (for example, the emitter region 121) by the p-n junction of the substrate 110 and the emitter region 121.

The holes moving to the emitter region 121 are collected by the front electrodes 141 and the front bus bars 142 and then move along the front bus bars 142. The electrons moving to the substrate 110 pass through the back surface field regions 172, are collected by the back electrodes 151 and the back bus bars 152, and move along the back bus bars 152. When the front bus bars 142 are connected to the back bus bars 152 using electric wires such as a conductive film, current flows therein to thereby enable use of the current for electric power.

As described above, each of the front surface and the back surface of the substrate 110 has the double texturing structure including the first protrusions 11 having the size of several μm and the second protrusions 111 having the size of several hundreds of nm, the incident area of the substrate 110 increases. Further, a reflection amount of light decreases due to a reflection operation using the first and second protrusions 11 and 111, and an amount of light incident on the substrate 110 increases.

The efficiency of the solar cell is improved by the anti-reflection effect using the refractive indexes of the anti-reflection layer 130 and the passivation layer 190, the field passivation effect using the fixed charges, and the surface passivation effect using hydrogen (H) or oxygen (O).

A method for manufacturing the solar cell according to the embodiment of the invention is described below with reference to FIGS. 4A to 4H.

Figure 4A:
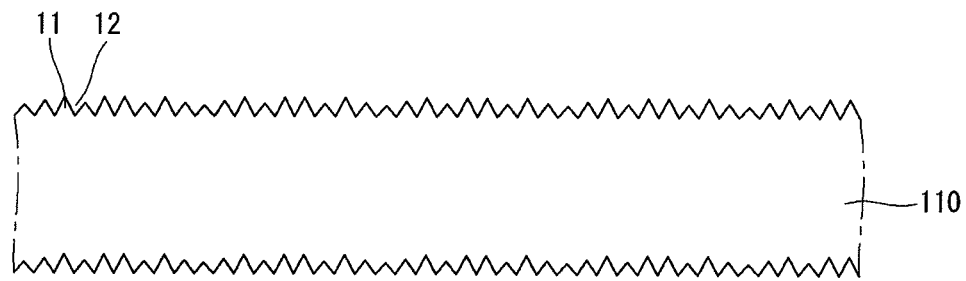
FIGS. 4A to 4H sequentially illustrate a method for manufacturing a solar cell according to an example embodiment of the invention.

As shown in FIG. 4A, a wet etching process is performed on a front surface and a back surface of a substrate 110 of a first conductive type (for example, n-type) to form a first textured surface having a plurality of first protrusions 11 and a plurality of first depressions 12.

The substrate 110 may be a crystalline semiconductor formed of single crystal silicon.

When the substrate 110 is formed of single crystal silicon, the first textured surface 11(12) may be formed using an alkali solution such as isopropyl alcohol (IPA) or potassium hydroxide (KOH).

Each of the first protrusions 11 may have a pyramid shape, such as a triangular pyramid. A diameter (i.e., size) and a protruding height of each first protrusion 11 may be about 5 μm to 10 μm.

Figure 4B:
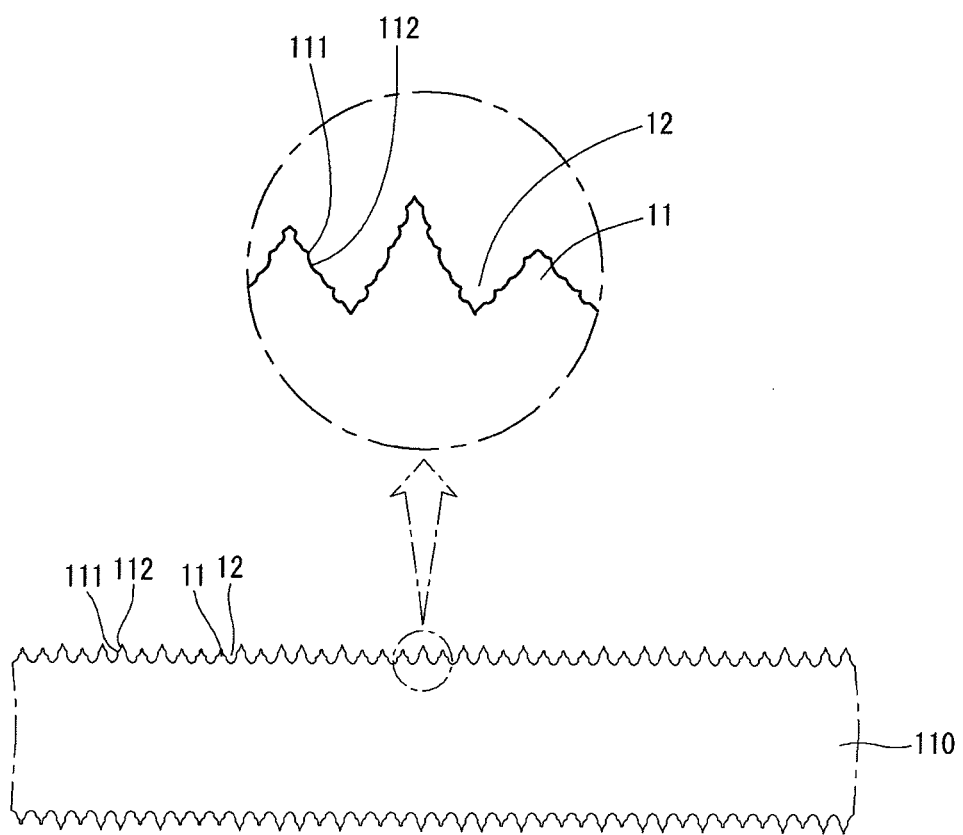

Next, as shown in FIG. 4B, after the first textured surface 11(12) is formed, a second textured surface having a plurality of second protrusions 111 and a plurality of second depressions 112 is formed on the surface of each first protrusion 11 using a dry etching method such as a reaction ion etching (RIE) method.

A maximum diameter (i.e., size) and a protruding height of each second protrusion 111 may be about 300 nm to 600 nm.

In the embodiment of the invention, an etching gas used in the RIE method may be a mixture of $SF_6$ and $Cl_2$. Other gases may be used.

After the second textured surface 111(112) is formed, a process for removing a remainder of the surface (or a portion of a surface layer) of the substrate 110 may be additionally performed. The remainder may be removed using a dry gas (used in the dry etching method) of a process room (or chamber) used to form the second textured surface 111(112), instead of the use of a separate process room (or chamber). In this instance, time required in the removing process of the remainder using the dry etching method is further reduced as compared to the wet etching method.

Further, if the remainder is removed using the wet etching method, the uneven portions of the first and second textured surfaces may be deformed. However, when the remainder is removed using the dry etching method, the uneven portions of the first and second textured surfaces are not deformed, and thus changes or deviations in the reflectance of light resulting from the first and second textured surfaces are not generated.

Figure 4C:
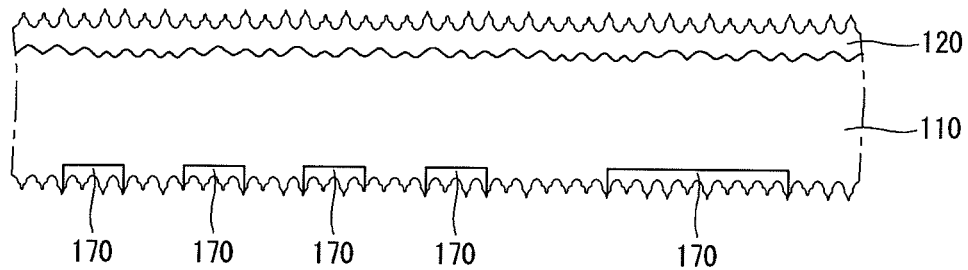

Next, as shown in FIG. 4C, ions (hereinafter, referred to as 'first impurity ions') of first impurities of a predetermined conductive type are implanted into the front surface of the substrate 110 using an ion implantation method.

In this instance, the predetermined conductive type may be a second conductive type (for example, p-type) opposite the first conductive type of the substrate 110. In the embodiment of the invention, the first impurities may use boron (B). Thus, the first impurity ions may be positive ions $B^+$ of boron (B).

More specifically, the first impurity ions of the second conductive type are implanted into the exposed front surface of the substrate 110 to form an impurity region, i.e., a first impurity region 120 of the second conductive type at the front surface of the substrate 110.

Subsequently, ions (hereinafter, referred to as 'second impurity ions') of second impurities of a predetermined conductive type (i.e., the first conductive type) are implanted into the back surface of the substrate 110 using the ion implantation method to form a second impurity region 170 of the first conductive type at the back surface of the substrate 110.

In the embodiment of the invention, the second impurities may use phosphorus (P). Thus, the second impurity ions may be positive ions $P^+$ of phosphorus (P).

A mask to implant the ions only into a desired region of each of the front surface and the back surface of the substrate 110 may be used in the ion implantation process for forming the first and second impurity regions 120 and 170.

For example, the mask positioned on the front surface of the substrate 110 may block only an edge of the front surface of the substrate 110 and may expose a remaining portion of the front surface of the substrate 110 except the edge. Further, the mask positioned on the back surface of the substrate 110 may expose only a region to form a back surface field region and may block a remaining portion of the back surface of the substrate 110.

Acceleration energy of ions for implanting the first and second impurity ions into the substrate 110 may be about 1 keV to 20 keV. An implantation depth of ions may be determined depending on the acceleration energy.

Thus, acceleration energy for the first impurity region 120 may be different from acceleration energy for the second impurity region 170. For example, acceleration energy used to implant ions of p-type impurities into the substrate 110 may be greater than acceleration energy used to implant ions of n-type impurities into the substrate 110.

In the embodiment of the invention, formation order of the first impurity region 120 and the second impurity region 170 may vary. The first impurity region 120 and the second impurity region 170 may be formed in the same chamber or respective chambers.

Figure 4D:
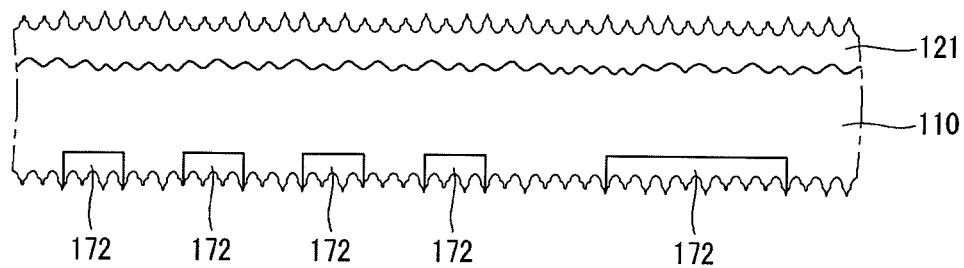

Next, as shown in FIG. 4D, after the first and second impurity regions 120 and 170 are formed, a thermal process is performed on the substrate 110 having the first and second impurity regions 120 and 170 in an atmosphere of nitrogen ($N_2$) or oxygen ($O_2$). Thus, the first and second impurity regions 120 and 170 are completely activated. Hence, the first impurity region 120 forms an emitter region 121 positioned at the front surface of the substrate 110, and thus the emitter region 121 and the substrate 110 form a p-n junction. Further, the second impurity region 170 forms a plurality of back surface field regions 172 positioned at the back surface of the substrate 110.

In other words, an implantation state of the p-type and n-type impurity ions of the first and second impurity regions 120 and 170 changes from an interstitial state to a substitutional state because of the activation of the first and second impurity regions 120 and 170 through the thermal process. Hence, silicon and the p-type and n-type impurity ions are rearranged. As a result, the first and second impurity regions 120 and 170 respectively serve as the p-type emitter region 121 and the n-type back surface field regions 172.

Solubility of boron (B) used to form the emitter region 121 is less than solubility of phosphorus (P) used to form the back surface field regions 172. Therefore, an activation temperature of the first and second impurity regions 120 and 170 is determined based on the first impurity region 120, so as to stably activate the first impurity region 120.

The activation temperature of the first and second impurity regions 120 and 170 may be about 1,000° C. to 2,000° C., and time required in the thermal process may be about 20 minutes to 60 minutes.

In the embodiment of the invention, because the activation process is performed at a high temperature equal to or higher than about 1,000° C. capable of stably activating boron (B), the first impurity region 120 as well as the second impurity region 170 are stably activated. Hence, the emitter region 121 and the back surface field regions 172 are smoothly formed.

Furthermore, because the thermal process is performed at the high temperature equal to or higher than about 1,000° C., a damaged portion generated in the ion implantation process for the first and second impurity regions 120 and 170 is recrystallized. Hence, the damaged portion generated in the ion implantation process is recovered without a separate damage removal process using the wet etching method, etc.

When the second textured surface 111(112) is formed using the RIE method, a damaged portion of the surface of the substrate 110 is generated because of plasma generated in the process. However, as described above, the damaged portion is recovered by the recrystallization of silicon (Si) through the thermal process performed at the high temperature equal to or higher than about 1,000° C. Therefore, a separate damage removal process using the wet etching method, etc., is not necessary.

Because of these reasons, the removing process of the remainder, which may be performed after the formation of the first and second textured surfaces, may be omitted.

In the embodiment of the invention, the damaged portion, which is formed in the surface of the substrate 110 (or the emitter region 121) in the RIE process and the ion implantation process, is recovered by the activation process of the first impurity region 120 at the high temperature (equal to or higher than about 1,000° C.) for the p-type emitter region 121. Hence, the reflectance of light of a short wavelength band incident on the emitter region 121 does not increase.

Figure 4E:
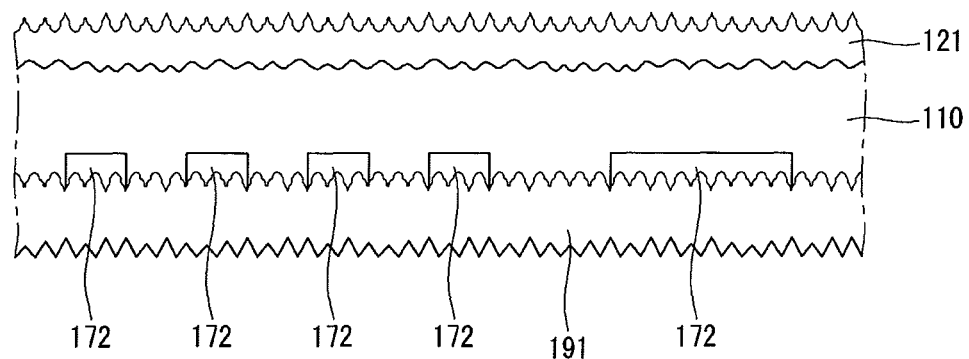

Next, as shown in FIG. 4E, a first passivation layer 191 formed of hydrogenated silicon nitride (SiNx:H) is formed on the back surface of the substrate 110. The first passivation layer 191 may be formed using a deposition method such as a plasma enhanced chemical vapor deposition (PECVD) method. In the embodiment of the invention, the first passivation layer 191 may have a thickness of about 70 nm to 100 nm.

Figure 4F:
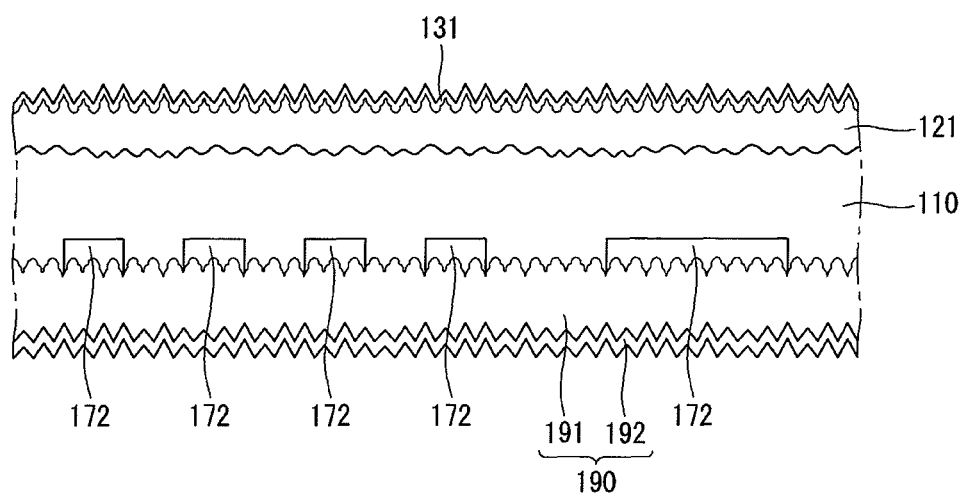

Next, as shown in FIG. 4F, layers formed of aluminum oxide ($Al_2O_3$) are respectively formed on the emitter region 121 positioned at the front surface of the substrate 110 and the first passivation layer 191 positioned on the back surface of the substrate 110 to form a first anti-reflection layer 131 on the emitter region 121 and a second passivation layer 192 on the first passivation layer 191.

The aluminum oxide layers may be formed using the PECVD method, an atomic layer deposition (ALD) method, etc.

When the aluminum oxide layer is formed using the PECVD method, the layer is stacked only in a portion exposed by a process gas. Therefore, the first anti-reflection layer 131 and the second passivation layer 192, each of which is formed of aluminum oxide, are respectively formed on the front surface and the back surface of the substrate 110 through the separate PECVD method.

In this instance, the first anti-reflection layer 131 and the second passivation layer 192 respectively positioned on the front surface and the back surface of the substrate 110 may be formed under the same process conditions to thereby have the same characteristics. Alternatively, the first anti-reflection layer 131 and the second passivation layer 192 may be formed under different process conditions to thereby have different characteristics.

However, when the aluminum oxide layers are formed using the ALD method, the aluminum oxide layers may be formed on the front surface, the back surface, and the lateral surface of the substrate 110 through one stacking process. Thus, the aluminum oxide layers are simultaneously formed on the front surface and the back surface of the substrate 110 through one ALD process to form the first anti-reflection layer 131 and the second passivation layer 192.

Because the first anti-reflection layer 131 and the second passivation layer 192 respectively positioned on the front surface and the back surface of the substrate 110 are formed under the same process conditions, the first anti-reflection layer 131 and the second passivation layer 192 have the same characteristics.

In the embodiment of the invention, the first anti-reflection layer 131 and the second passivation layer 192 may have a thickness of about 5 nm to 15 nm.

Hence, a passivation layer 190 including the first and second passivation layers 191 and 192 is formed on the back surface of the substrate 110.

Figure 4G:
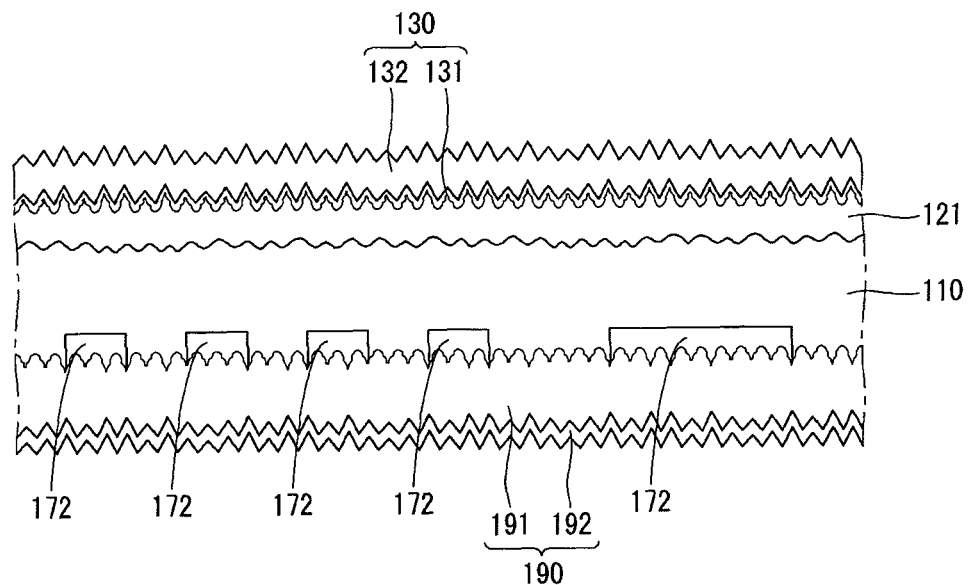

Next, as shown in FIG. 4G, a second anti-reflection layer 132 formed of hydrogenated silicon nitride (SiNx:H) is formed on the first anti-reflection layer 131 using the PECVD method at a thickness of about 70 nm to 100 nm. Hence, an anti-reflection layer 130 including the first and second anti-reflection layers 131 and 132 is formed.

As described above, the anti-reflection layer 130 including the first anti-reflection layer 131 formed of aluminum oxide ($Al_2O_3$) and the second anti-reflection layer 132 formed of hydrogenated silicon nitride (SiNx:H) is formed on the front surface of the substrate 110, and the passivation layer 190 including the first passivation layer 191 formed of hydrogenated silicon nitride (SiNx:H) and the second passivation layer 192 formed of aluminum oxide ($Al_2O_3$) is formed on the back surface of the substrate 110. Afterward, a front electrode part 140 including a plurality of front electrodes 141 and a plurality of front bus bars 142, which pass through the anti-reflection layer 130 and abut on the emitter region 121 underlying the anti-reflection layer 130, is formed. Further, a back electrode part 150 including a plurality of back electrodes 151 and a plurality of back bus bars 152, which pass through the passivation layer 190 and abut on the back surface field regions 172 underlying the passivation layer 190, is formed. As a result, the solar cell shown in FIGS. 1 and 2 is completed.

An example of a method for forming the front electrode part 140 and the back electrode part 150 is described with reference to FIG. 4H.

Figure 4H:
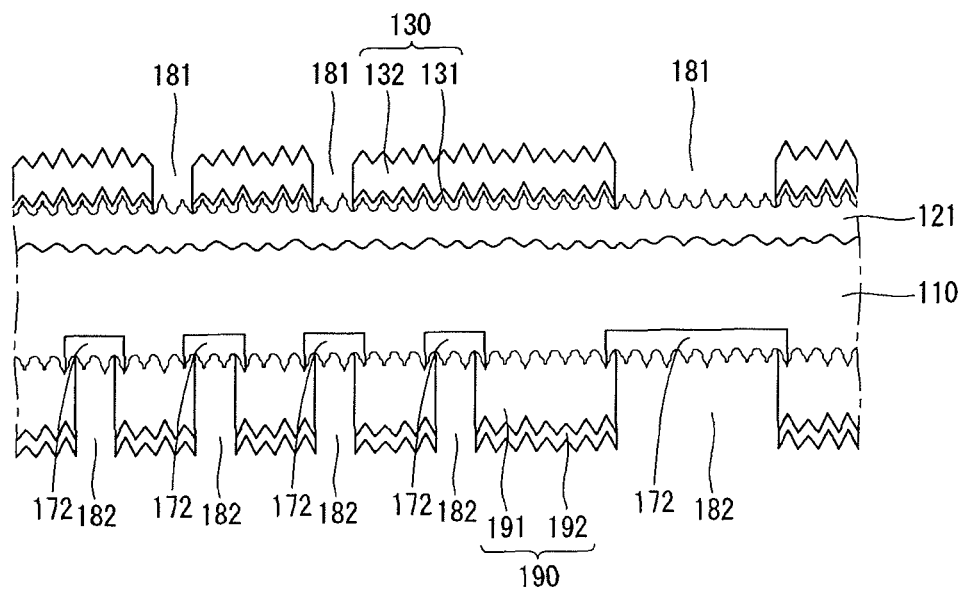

For example, as shown in FIG. 4H, a laser beam is selectively irradiated onto each of the front surface and the back surface of the substrate 110 to form a plurality of first and second openings 181 and 182 at a location to form the front electrode part 140 and the back electrode part 150.

The plurality of first openings 181 pass through the anti-reflection layer 130 and expose the emitter region 121 underlying the opened portions of the anti-reflection layer 130. The plurality of second openings 182 pass through the passivation layer 190 and expose the back surface field regions 172 underlying the opened portions of the passivation layer 190.

The plurality of first openings 181 are used to form the plurality of front electrodes 141 and the plurality of front bus bars 142. In this instance, a width of the first opening 181 for each front electrode 141 is less than a width of the first opening 181 for each front bus bar 142.

The plurality of second openings 182 are used to form the plurality of back electrodes 151 and the plurality of back bus bars 152. In this instance, a width of the second opening 182 for each back electrode 151 is less than a width of the second opening 182 for each back bus bar 152.

The number of first openings 181 for the front electrodes 141 may be less than the number of second openings 182 for the back electrodes 151. Hence, a distance between the two adjacent first openings 181 may be greater than a distance between the two adjacent second openings 182.

The first openings 181 for the front bus bars 142 may be positioned opposite the second openings 182 for the back bus bars 152 with the substrate 110 between them.

Subsequently, the front electrode part 140 and the back electrode part 150 are respectively formed on the emitter region 121 and the back surface field regions 172 exposed by the first and second openings 181 and 182 using an electroplating method or an electroless plating method.

In another embodiment, the front electrodes 141, the front bus bars 142, the back electrodes 151, and the back bus bars 152 may be formed by coating a metal paste containing a metal material such as silver (Ag) on the first and second openings 181 and 182 using a screen printing method, etc., and then performing a thermal process on the metal paste at a desired temperature.

In another embodiment, the front electrodes 141, the front bus bars 142, the back electrodes 151, and the back bus bars 152 may be formed by coating and drying a metal paste containing at least one of silver (Ag) and aluminum (Al) on the anti-reflection layer 130 and the passivation layer 190 and then performing a thermal process on the metal paste. Hence, the front electrode part 140 including the front electrodes 141 and the front bus bars 142 may be formed on the emitter region 121, and the back electrode part 150 including the back electrodes 151 and the back bus bars 152 may be formed on the back surface field regions 172.

Because the front electrode part 140 and the back electrode part 150 have to partially pass through the anti-reflection layer 130 and the passivation layer 190, respectively, the metal paste may contain an etchant, for example, PbO for etching the anti-reflection layer 130 and the passivation layer 190. An amount and a kind of the etchant contained in the metal paste may be determined depending on a thickness or a material of the anti-reflection layer 130 and the passivation layer 190.

When the thermal process is performed on the metal paste coated on the anti-reflection layer 130 and the passivation layer 190, the metal paste passes through the anti-reflection layer 130 and the passivation layer 190 and is chemically bonded to the emitter region 121 and the back surface field regions 172 underlying the anti-reflection layer 130 and the passivation layer 190. Hence, the front electrode part 140 electrically and physically connected to the emitter region 121 and the back electrode part 150 electrically and physically connected to the back surface field regions 172 are formed.

When at least one of the anti-reflection layer 130 and the passivation layer 190 is omitted, at least one of the front electrode part 140 and the back electrode part 150 may not contain the etchant because it does not need to pass through the omitted component (i.e., at least one of the anti-reflection layer 130 and the passivation layer 190).

When at least one of the front bus bar 142 and the back bus bar 152 is positioned directly on the anti-reflection layer 130 or the passivation layer 190, at least one of the front bus bar 142 and the back bus bar 152 may not contain the etchant because it does not need to pass through the anti-reflection layer 130 or the passivation layer 190. Alternatively, at least one of the front bus bar 142 and the back bus bar 152 may contain a small amount of the etchant which may not pass through the anti-reflection layer 130 or the passivation layer 190.

In this instance, at least one of the front electrode 141, the front bus bar 142, the back electrode 151, and the back bus bar 152 may be formed of a material different from other components.

Another example of a solar cell according to an example embodiment of the invention is described below with reference to FIG. 5.

Structures and components identical or equivalent to those described in the solar cell shown in FIGS. 1 to 3 are designated with the same reference numerals, and a further description may be briefly made or may be entirely omitted.

Figure 5:
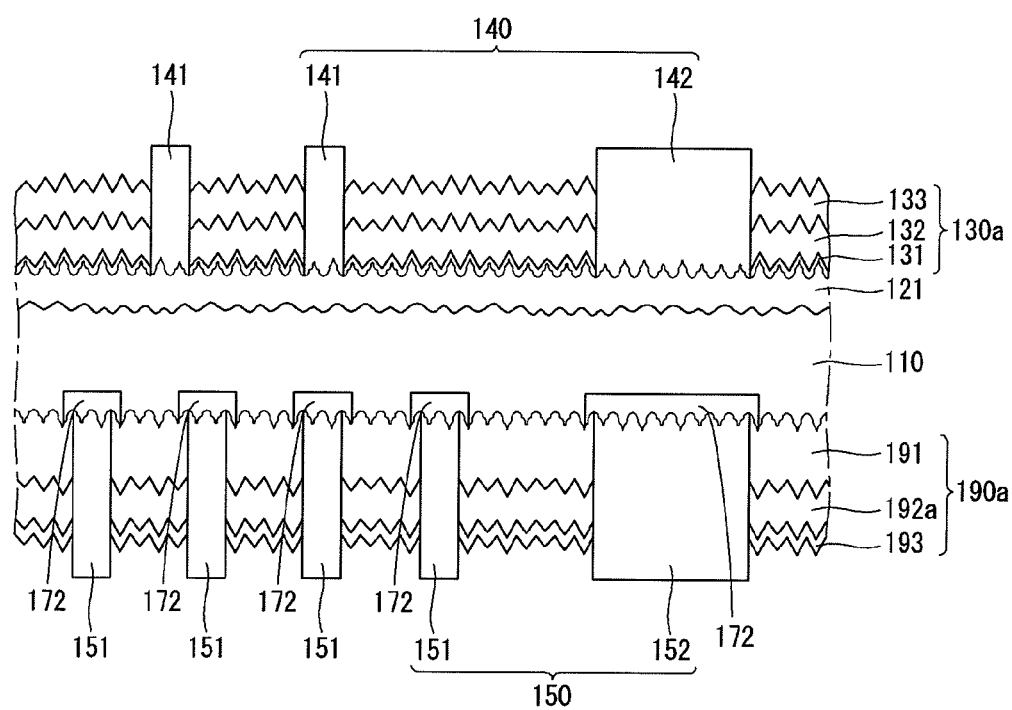
FIG. 5 is a partial cross-sectional view of another example of a solar cell according to an example embodiment of the invention.

Unlike the solar cell shown in FIGS. 1 and 2, a solar cell shown in FIG. 5 further includes hydrogenated silicon oxide (SiOx:H) layers on hydrogenated silicon nitride (SiNx:H) layers respectively positioned on a front surface and a back surface of a substrate 110.

More specifically, an anti-reflection layer 130a positioned on the front surface of the substrate 110 further includes a third anti-reflection layer 133, which is positioned directly on a second anti-reflection layer 132 and is formed of hydrogenated silicon oxide (SiOx:H), in addition to a first anti-reflection layer 131 formed of aluminum oxide ($Al_2O_3$) and the second anti-reflection layer 132 formed of hydrogenated silicon nitride (SiNx:H). Hence, the anti-reflection layer 130a has a triple-layered structure including the layers 131 to 133.

Further, a passivation layer 190a positioned on the back surface of the substrate 110 includes a first passivation layer 191 formed of hydrogenated silicon nitride (SiNx:H), a second passivation layer 192a, which is positioned directly on the first passivation layer 191 and is formed of hydrogenated silicon oxide (SiOx:H), and a third passivation layer 193, which is positioned directly on the second passivation layer 192a and is formed of aluminum oxide ($Al_2O_3$).

In other words, the solar cell shown in FIG. 5 further includes the hydrogenated silicon oxide layer between the hydrogenated silicon nitride layer and the aluminum oxide layer, unlike the solar cell shown in FIGS. 1 and 2. Thus, the passivation layer 190a has a triple-layered structure including the layers 191, 192a, and 193.

As described above, the hydrogenated silicon oxide layers 133 and 192a positioned directly on the hydrogenated silicon nitride layers 132 and 191 prevent hydrogen (H), which is contained in the hydrogenated silicon nitride layers 132 and 191 and performs a surface passivation function, from moving in a direction opposite the substrate 110. Thus, the hydrogenated silicon oxide layers 133 and 192a included in the anti-reflection layer 130a and the passivation layer 190a serve as capping layers of the hydrogenated silicon nitride layers 132 and 191 underlying the hydrogenated silicon oxide layers 133 and 192a.

The hydrogenated silicon oxide layers 133 and 192a contain hydrogen (H) capable of recovering a defect. Hence, hydrogen (H) contained in the hydrogenated silicon oxide layers 133 and 192a moves to the surface of the substrate 110 and performs the surface passivation function.

Accordingly, a surface passivation effect is further improved by the hydrogenated silicon oxide layers 133 and 192a respectively positioned on the front surface and the back surface of the substrate 110.

The hydrogenated silicon oxide layers 133 and 192a are formed using a PECVD method. Unlike the formation order of the anti-reflection layer 130 and the passivation layer 190 in the solar cell shown in FIGS. 1 and 2, the anti-reflection layer 130a and the passivation layer 190a are formed in the following formation order.

For example, after the first passivation layer 191 formed of hydrogenated silicon nitride (SiNx:H) is formed on the back surface of the substrate 110 using the PECVD method, the second passivation layer 192a formed of hydrogenated silicon oxide (SiOx:H) is formed on the first passivation layer 191 using the PECVD method. Then, the third passivation layer 193 and the first anti-reflection layer 131, each of which is formed of aluminum oxide ($Al_2O_3$), are simultaneously formed on the second passivation layer 192a and the emitter region 121 positioned at the front surface of the substrate 110 using an ALD method, respectively. Then, the second anti-reflection layer 132 formed of hydrogenated silicon nitride (SiNx:H) and the third anti-reflection layer 133 formed of hydrogenated silicon oxide (SiOx:H) are sequentially formed on the first anti-reflection layer 131 positioned on the front surface of the substrate 110 using the PECVD method.

The solar cell shown in FIG. 5 is manufactured through the manufacturing processes illustrated in FIGS. 4A to 4F, except the formation method and the formation order of the anti-reflection layer 130a and the passivation layer 190a.

The third anti-reflection layer 133 and the second passivation layer 192a, each of which is formed of hydrogenated silicon oxide (SiOx:H) may have a thickness of about 50 nm to 100 nm and a refractive index of about 1.5.

As described above, the second anti-reflection layer 132 and the first passivation layer 191 formed of hydrogenated silicon nitride (SiNx:H) are respectively capped by the third anti-reflection layer 133 and the second passivation layer 192a formed of hydrogenated silicon oxide (SiOx:H). Hence, the passivation function performed by the second anti-reflection layer 132 and the first passivation layer 191 is further improved. Further, the passivation effect of the solar cell shown in FIG. 5 is further improved because of the passivation function performed by the third anti-reflection layer 133 and the second passivation layer 192a.

Because the anti-reflection layer 130a and the passivation layer 190a further include the third anti-reflection layer 133 and the second passivation layer 192a formed of hydrogenated silicon oxide (SiOx:H), the anti-reflection effect at the front surface and the back surface of the substrate 110 is improved. Hence, an amount of light incident on the substrate 110 increases, and an amount of electric current output from the solar cell increases.

Other examples of the solar cell shown in FIGS. 1 to 3 and the solar cell shown in FIG. 5 are described below with reference to FIGS. 6 and 7.

Figure 6:
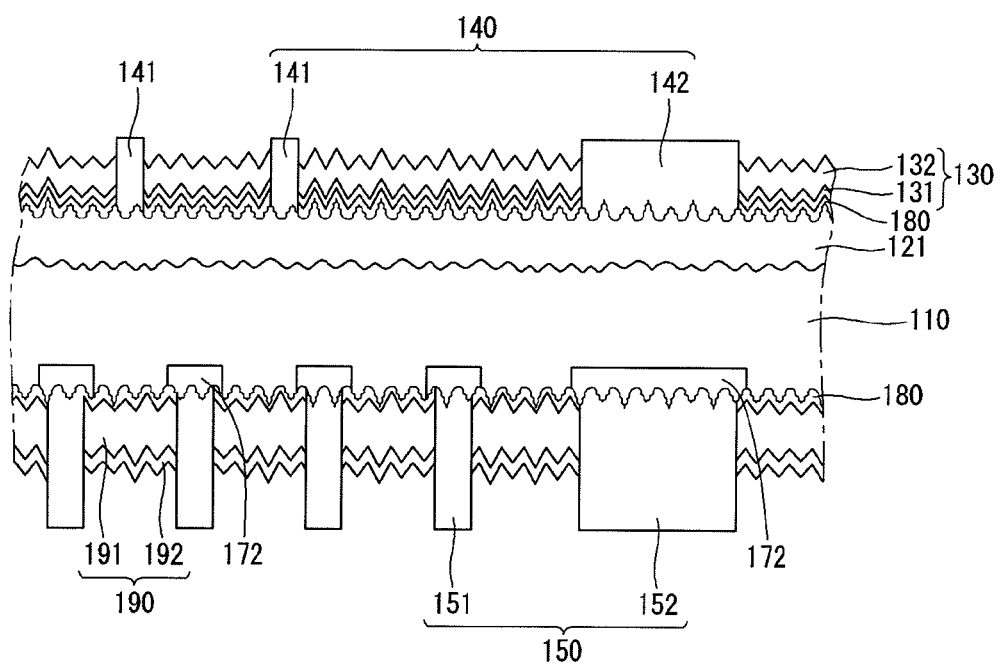
FIGS. 6 and 7 are partial cross-sectional views of other examples of a solar cell according to an example embodiment of the invention.

FIG. 6 illustrates another example of the solar cell shown in FIGS. 1 to 3, and FIG. 7 illustrates another example of the solar cell shown in FIG. 5.

Figure 7:
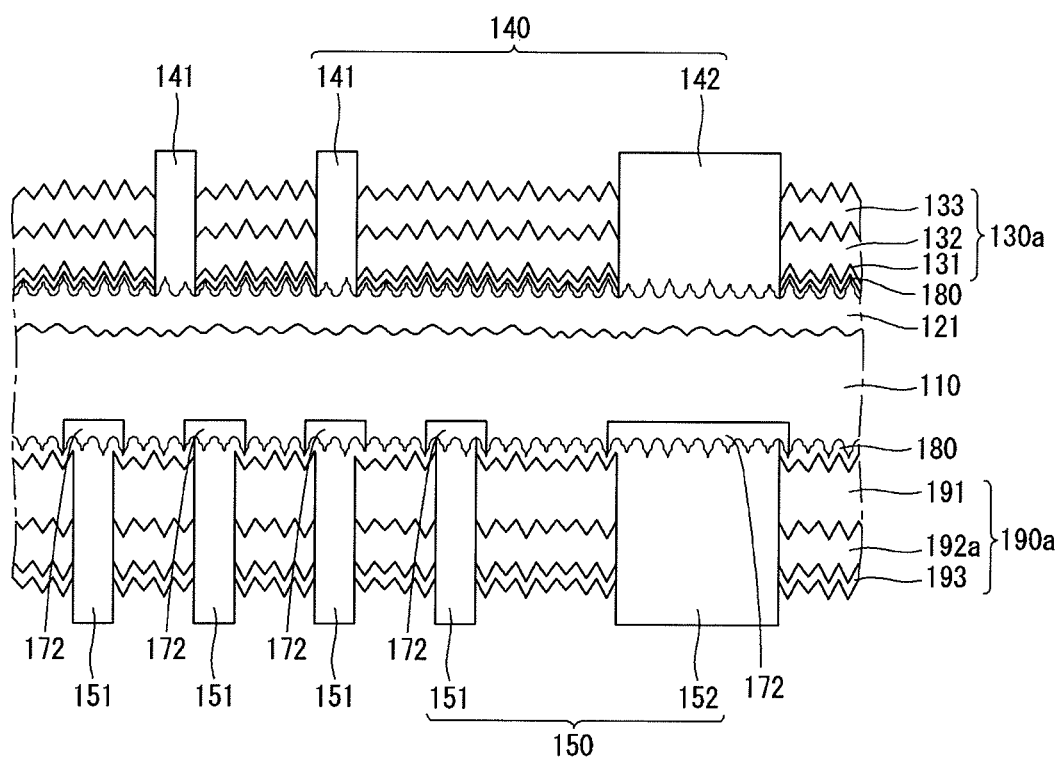

The solar cells shown in FIGS. 6 and 7 further include a silicon oxide (SiOx) layer 180 between an emitter region 121 and an anti-reflection layer 130 (130a) and between a back surface of a substrate 110 and a first passivation layer 191, unlike the solar cell shown in FIGS. 1 to 3 and the solar cell shown in FIG. 5.

The solar cells shown in FIGS. 6 and 7 substantially have the same configuration as the solar cell shown in FIGS. 1 to 3 and the solar cell shown in FIG. 5, except the silicon oxide layer 180, respectively.

As shown in FIGS. 6 and 7, the silicon oxide layer 180 is positioned directly on the emitter region 121 positioned at a front surface of the substrate 110 and directly on the back surface of the substrate 110. The anti-reflection layer 130 (130a) and a passivation layer 190 (190a) are positioned directly on the silicon oxide layer 180.

The silicon oxide layer 180 is an oxide layer deliberately formed by immersing the substrate 110 in a desired chemical solution. A thickness of the silicon oxide layer 180 may be about 2 nm to 3 nm.

In the method for manufacturing the solar cell illustrated in FIGS. 4A to 4F, after the emitter region 121 is formed, the silicon oxide layer 180 is formed before forming the anti-reflection layer 130 and the passivation layer 190.

The silicon oxide layer 180 is formed by immersing the substrate 110 in a nitric acid ($NHO_3$) solution having a hydrogen ion concentration (pH) of about 2 to 4 at a process temperature of the normal temperature to about 70° C. for about 5 minutes to 30 minutes. A concentration of $NHO_3$ in the $NHO_3$ solution, i.e., an amount of $NHO_3$ in the $NHO_3$ solution may be about 65% to 70%.

In the process for forming the anti-reflection layer 130 (130a) and the passivation layer 190 (190a) on the emitter region 121 and the back surface field regions 172, a natural oxide layer generated by oxygen existing in the atmosphere or the process room is generally formed directly on the emitter region 121. The natural oxide layer formed thus is unstably bonded to silicon existing in the substrate 110 or the emitter region 121, thereby generating a defect. In embodiments of the invention, the natural oxide layer is one that is formed spontaneously and unintentionally.

When the layer such as the aluminum oxide ($Al_2O_3$) layer is formed on the natural oxide layer, water ($H_2O$) is generated by the bond between hydrogen (H) contained in a process material for the layer formation and the natural oxide layer having the unstable bond. Further, a blistering phenomenon such as a spot resulting from the formation of a hydrogen molecule is generated.

However, in the embodiment of the invention, the silicon oxide layer 180 having the characteristics better than the natural oxide layer is formed directly on each of the front surface and the back surface of the substrate 110 using the separate PECVD method. Therefore, the frequency of problem generated by a bond of hydrogen and oxygen is greatly reduced.

Oxygen contained in the silicon oxide layer 180 performs the passivation function for converting the bonds existing at the surface of the substrate 110 into stable bonds, thereby further improving the surface passivation effect.

As shown in FIGS. 6 and 7, the silicon oxide layer 180 is formed on both the front surface and the back surface of the substrate 110. In another embodiment, the silicon oxide layer 180 may be formed on only one of the front surface and the back surface of the substrate 110.

As described above, the silicon oxide layer 180 is formed so as to improve the surface passivation effect at the front surface and the back surface of the substrate 110 and to reduce the problem resulting from the natural oxide layer. Therefore, the silicon oxide layer 180 is not required to be thick and may have a thickness of about 2 nm to 3 nm.

The embodiment of the invention was described based on a bifacial solar cell, in which light is incident on both the front surface and the back surface of the substrate 110. The embodiment of the invention may be applied to other kinds of solar cells, for example, other kinds of solar cells using n-type single crystal silicon.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a substrate formed of an n-type crystalline semiconductor;
an emitter region of a p-type positioned at a first surface of the substrate;
an anti-reflection layer positioned on the first surface of the substrate;
a passivation layer positioned on a second surface which is opposite of the first surface of the substrate;
a first electrode which is positioned on the first surface of the substrate and is connected to the emitter region; and
a second electrode which is positioned on the second surface of the substrate and is connected to the substrate,
wherein the anti-reflection layer includes a first anti-reflection layer formed of aluminum oxide,
a second anti-reflection layer which is positioned directly on the first anti-reflection layer and is formed of hydrogenated silicon nitride, and
a third anti-reflection layer which is positioned directly on the second anti-reflection layer and is formed of hydrogenated silicon oxide,
wherein the passivation layer includes a first passivation layer formed of hydrogenated silicon nitride,
a second passivation layer which is positioned directly on the first passivation layer and is foamed of hydrogenated silicon oxide, and
a third passivation layer which is positioned directly on the second passivation layer and is formed of aluminum oxide,
wherein the emitter region has a first textured surface including a plurality of first protrusions each having a protruding height and a maximum diameter which are within a range of about 5 μm to 10 μm, and
wherein each of the plurality of first protrusions has a second textured surface including a plurality of second protrusions each having a protruding height and a maximum diameter which are within a range of about 300 nm to 600 nm.

2. The solar cell of claim 1, wherein the first anti-reflection layer has a thickness of about 5 nm to 15 nm.

3. The solar cell of claim 2, wherein each of the second anti-reflection layer and the first passivation layer has a thickness of about 70 nm to 100 nm.

4. The solar cell of claim 1, wherein the second passivation layer has a thickness of about 50 nm to 100 nm.

5. The solar cell of claim 1, further comprising a silicon oxide layer positioned between the second surface of the substrate and the first passivation layer.

6. The solar cell of claim 5, wherein the silicon oxide layer has a thickness of about 2 nm to 3 nm.

7. The solar cell of claim 1, wherein the first surface and the second surface of the substrate are incident surfaces on which light is incident.

8. The solar cell of claim 1, wherein the hydrogenated silicon oxide of the third anti-reflective layer and the second passivation layer each has a thickness of about 50 nm to 100 nm.

9. The solar cell of claim 1, further comprising a silicon oxide layer positioned between the emitter region and the first anti-reflection layer.

10. The solar cell of claim 9, wherein the silicon oxide layer has a thickness of about 2 nm to 3 nm.

11. The solar cell of claim 1, wherein acicular ends of the plurality of second protrusions point in a parallel direction as vertices of the plurality of first protrusions.

12. The solar cell of claim 1, wherein the first and second textured surfaces are also formed on the second surface of the substrate.

13. The solar cell of claim 1, wherein each of the plurality of second protrusions has an acicular end, and acicular ends of adjacent second protrusions are connected by serrated edges.

* * * * *